(12) United States Patent
Hiruma

(10) Patent No.: US 6,664,625 B2
(45) Date of Patent: Dec. 16, 2003

(54) MOUNTING STRUCTURE OF A SEMICONDUCTOR DEVICE

(75) Inventor: Akiomi Hiruma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/271,571

(22) Filed: Oct. 17, 2002

(65) Prior Publication Data
US 2003/0168728 A1 Sep. 11, 2003

(30) Foreign Application Priority Data
Mar. 5, 2002 (JP) ........................................ 2002-059220

(51) Int. Cl.$^7$ .................... H01L 23/12; H01L 23/48; H01L 23/02
(52) U.S. Cl. .................. 257/700; 257/686; 257/737
(58) Field of Search .................. 257/737, 686, 257/778, 779, 736; 361/774; 29/852; 228/180.22

(56) References Cited

U.S. PATENT DOCUMENTS

| 4,893,172 A | * | 1/1990 | Matsumoto et al. | 257/668 |
| 5,553,769 A | * | 9/1996 | Ellerson et al. | 228/180.22 |
| 5,796,590 A | * | 8/1998 | Klein | 361/774 |
| 6,133,978 A | * | 10/2000 | Tajima | 349/150 |
| 6,204,163 B1 | * | 3/2001 | Panchou et al. | 438/613 |
| 6,208,027 B1 | * | 3/2001 | King et al. | 257/737 |
| 6,407,451 B2 | * | 6/2002 | Akram et al. | 257/698 |
| 6,495,926 B1 | * | 12/2002 | Bobba et al. | 257/786 |
| 2002/0109227 A1 | * | 8/2002 | Liu et al. | 257/737 |

FOREIGN PATENT DOCUMENTS

| JP | 1-148826 | * | 7/1986 | 257/737 |
| JP | 1-155633 | * | 6/1989 | 257/737 |
| JP | 6-160433 | | 6/1994 | |
| JP | 2000-22311 | | 1/2000 | |

* cited by examiner

Primary Examiner—Jasmine Clark
(74) Attorney, Agent, or Firm—Armstrong, Westerman & Hattori, LLP

(57) ABSTRACT

A semiconductor device comprises a substrate, a mounting chip, multi-stage bumps, and a sheet-like interposer member. The mounting chip is bonded to the substrate. The multi-stage bumps have two or more stages of bumps stacked and bonded so that the substrate and the mounting chip are electrically connected by the multi-stage bumps. The interposer member is of a resin material and provided in the stacked stages of the multi-stage bumps. The interposer member has openings each formed between two diagonally arrayed bumps of the multi-stage bumps.

11 Claims, 10 Drawing Sheets

MOUNTING STRUCTURE OF A SEMICONDUCTOR DEVICE

BACKGROUND OF THE INVENTION

1. Field of The Invention

The present invention generally relates to the mounting structure of a semiconductor device, and more particularly to a semiconductor device provided with a sheet-like interposer member interposed in the multi-stage bumps stacked and bonded between a mounting chip and a substrate. Further, the present invention relates to a method of manufacturing the semiconductor device.

2. Description of the Related Art

Conventionally, a semiconductor device, such as a ball-grid-array (BGA) package, on which a mounting chip including a semiconductor element is mounted via bump junctions is known widely.

With such semiconductor device, when thermal contraction arises to the bump junctions on the substrate or the mounting chip by the operating environment, they are subjected to the repeated stress over an extended period of time, which is liable to result in the trouble such as a crack or a fracture.

On the other hand, research and development efforts are being made about a semiconductor device applied to an engine control unit mounted on an automotive vehicle, etc.

At the present stage, the specifications of a chassis mount that is provided to mount the engine control unit on the chassis of the vehicle are established, and the verification thereof is advanced.

The above-mentioned semiconductor device requires adequate operational life and high reliability over an extended period of time in order for mounting it in a severe operating environment.

In the near future, the development of an engine control unit that is directly mounted on the engine of an automotive vehicle is due to be started. However, the semiconductor device on the present stage has the problem of the toughness of bump junctions as mentioned above, and it is difficult to attain the operating life and reliability that are demanded for the intended purpose.

For example, Japanese Laid-Open Patent Application No. 2000-22311 discloses a semiconductor device which includes an interposer substrate which connects the solder bumps of the adjoining stages of multi-stage solder bumps stacked and bonded between a printed circuit board and a mounting chip.

The conventional semiconductor device mentioned above is provided in order to prolong the life of the solder bump junctions by absorbing the shearing stress acting on the solder bumps on the upper and lower stages of the multi-stage solder bumps under the normal operating environment (the ambient temperature is, for example, in a range of −5 deg. C. to 40 deg. C.) by using the interposer substrate.

However, when the conventional semiconductor device is applied to the severe operating environment (the ambient temperature is, for example, in a range of −40 deg. C. to 125 deg. C.) of the engine control unit, the thermal contraction presented on the printed circuit board or the mounting chip is much greater than that in the normal operating environment.

Therefore, if the conventional semiconductor device is used over an extended period of time in the severe operating environment, the toughness of the interposer substrate that connects the solder bumps of the adjoining stages will become inadequate. In other words, the repeated stress acts on the interposer substrate or the solder bump junctions over an extended period of time, and it is liable to result in the trouble, such as a crack or a fracture, even in the case of the conventional semiconductor device.

Moreover, Japanese Laid-Open Patent Application No. 2000-22311 discloses that a soft film of a porosity material or a ceramic material is used for the interposer substrate, and that the film is formed with a plurality of slit-like openings between the laterally and longitudinally arranged solder bumps in order to absorb the distortion due to the repeated stress.

However, even if such arrangement is used, when it is applied to the severe operating environment of the engine control unit, it is difficult for the conventional semiconductor device to secure the operational life and reliability of the bump junctions over an extended period of time.

SUMMARY OF THE INVENTION

An object of the present invention is to provide an improved mounting structure of a semiconductor device in which the above-described problems are eliminated.

Another object of the present invention is to provide a semiconductor device that can secure the operational life and reliability of the bump junctions over an extended period of time even when the semiconductor device is used in a severe operating environment such as the case of being used on an automotive vehicle.

Another object of the present invention is to provide a method of manufacturing a semiconductor device that can secure the operational life and reliability of the bump junctions over an extended period of time even when the semiconductor device is used in a severe operating environment such as the case of being used on an automotive vehicle.

Another object of the present invention is to provide a sheet-like interposer member for use in a semiconductor device that can secure the operational life and reliability of the bump junctions over an extended period of time even when the semiconductor device is used in a severe operating environment such as the case of being used on an automotive vehicle.

The above-mentioned objects of the present invention are achieved by a semiconductor device comprising: a substrate; a mounting chip bonded to the substrate; multi-stage bumps having two or more stages of bumps stacked and bonded so that the substrate and the mounting chip are electrically connected by the multi-stage bumps; and a sheet-like interposer member of a resin material provided in the stacked stages of the multi-stage bumps and having openings each formed between two diagonally arrayed bumps of the multi-stage bumps.

The above-mentioned objects of the present invention are achieved by a semiconductor device comprising: a substrate; a mounting chip bonded to the substrate; multi-stage bumps having two or more stages of bumps stacked and bonded so that the substrate and the mounting chip are electrically connected by the multi-stage bumps; and a sheet-like interposer member of a resin material provided in the stacked stages of the multi-stage bumps and having openings each formed between two diagonally arrayed bumps of the multi-stage bumps, the interposer member having joint portions each interconnecting two adjacent bumps of the multi-stage bumps.

The above-mentioned objects of the present invention are achieved by a sheet-like interposer member for use in a semiconductor device including a substrate, a mounting chip bonded to the substrate, and multi-stage bumps having two or more stages of bumps stacked and bonded so that the substrate and the mounting chip are electrically connected by the multi-stage bumps, the interposer member provided in the stacked stages of the multi-stage bumps and having openings each formed between two diagonally arrayed bumps of the multi-stage bumps.

The above-mentioned objects of the present invention are achieved by a semiconductor device comprising: a ball-grid-array package; multi-stage bumps having two or more stages of bumps stacked and bonded so that the ball-grid-array package and an external integrated-circuit board are electrically connected by the multi-stage bumps; and a sheet-like interposer member of a resin material provided in the stacked stages of the multi-stage bumps and having openings each formed between two diagonally arrayed bumps of the multi-stage bumps.

The above-mentioned objects of the present invention are achieved by a method of manufacturing a semiconductor device including a substrate, a mounting chip bonded to the substrate, multi-stage bumps having two or more stages of bumps stacked and bonded so that the substrate and the mounting chip are electrically connected by the multi-stage bumps, and a sheet-like interposer member of a resin material provided in the stacked stages of the multi-stage bumps and having openings each formed between two diagonally arrayed bumps of the multi-stage bumps, the method comprising the steps of: bonding first bumps to a first surface of the interposer member; bonding second bumps to the mounting chip; bonding the first bumps of the first surface of the interposer member and the second bumps of the mounting chip by using a first bonding material applied to a second surface of the interposer member opposite to the first surface, so that the multi-stage bumps are formed with the interposer member and the mounting chip bonded together; applying a second bonding material to the substrate; and bonding the multi-stage bumps with the interposer member and the mounting chip bonded together, to the substrate by using the second bonding material applied to the substrate.

The above-mentioned objects of the present invention are achieved by a method of manufacturing a semiconductor device including a substrate, a including a substrate, a mounting chip bonded to the substrate, multi-stage bumps having two or more stages of bumps stacked and bonded so that the substrate and the mounting chip are electrically connected by the multi-stage bumps, and a sheet-like interposer member of a resin material provided in the stacked stages of the multi-stage bumps and having openings each formed between two diagonally arrayed bumps of the multi-stage bumps, the method comprising the steps of: bonding first bumps to a first surface of the interposer member; bonding the first bumps of the first surface of the interposer member to the substrate by using a first bonding material applied to the first surface; applying a second bonding material to a second surface of the interposer member opposite to the first surface; bonding second bumps to the mounting chip; and bonding the second bumps of the mounting chip and the first bumps of the interposer member with the substrate bonded thereto by using the second bonding material applied to the second surface, so that the multi-stage bumps are formed with the interposer member and the mounting chip bonded together. In the mounting structure of the semiconductor device of the present invention, the novel and useful sheet-like interposer member which is different from the conventional interposer member is used. When the semiconductor device is used in the severe operating environment of an engine control unit mounted on an automotive vehicle, the repeated stress acting on the bump junctions can be eased as much as possible, and the operating life and reliability can be improved by using the sheet-like interposer member.

Moreover, according to the manufacturing method of the semiconductor device of the present invention, the semiconductor device with high reliability can be produced with low cost by carrying out the known manufacturing processes with the sheet-like interposer member.

BRIEF DESCRIPTION OF THE DRAWINGS

Other objects, features and advantages of the present invention will become apparent from the following detailed description when read in conjunction with the accompanying drawings.

DETAILED DESCRIPTION OF PREFERRED EMBODIMENTS

A description will now be given of preferred embodiments of the present invention with reference to the accompanying drawings.

Figure 1:
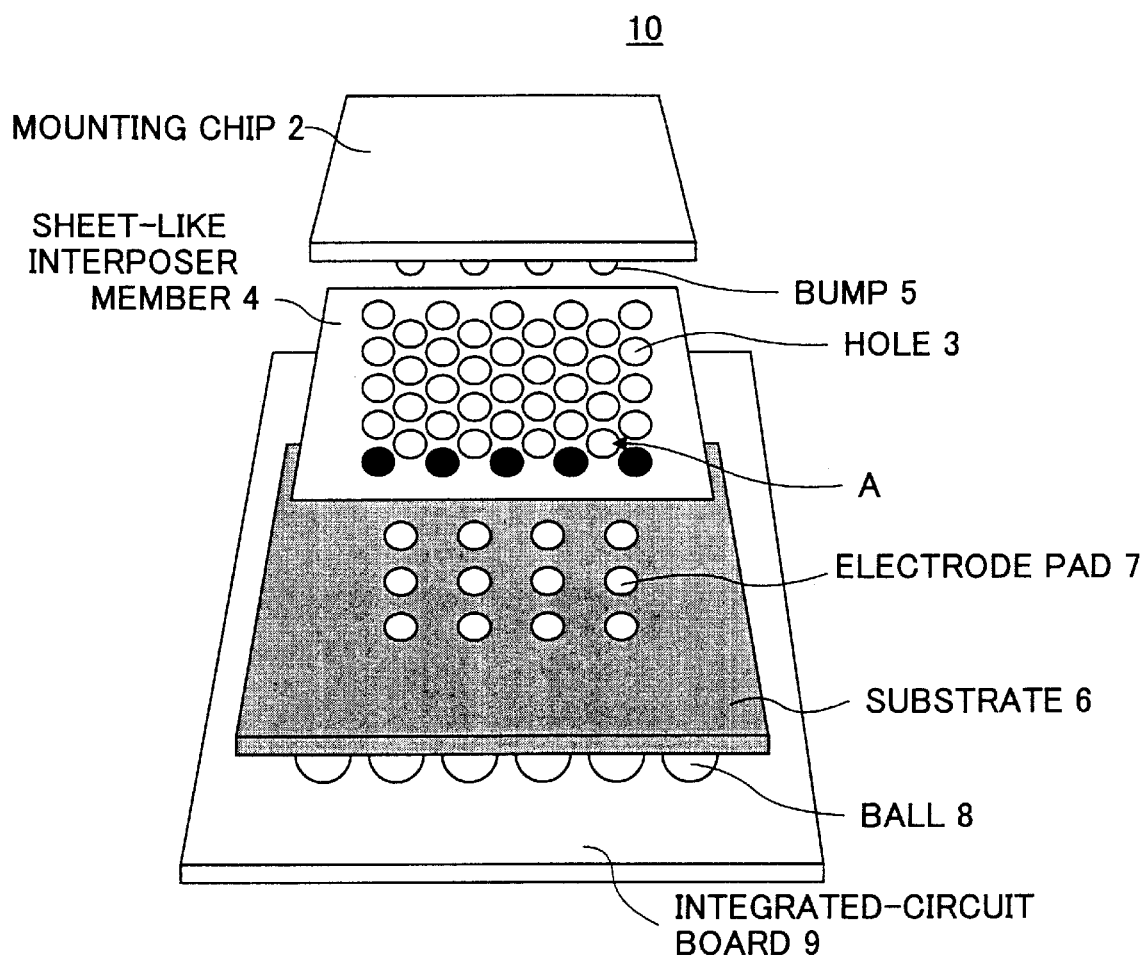
FIG. 1 is an exploded perspective view of one embodiment of the semiconductor device according to the present invention.
Figure 2:
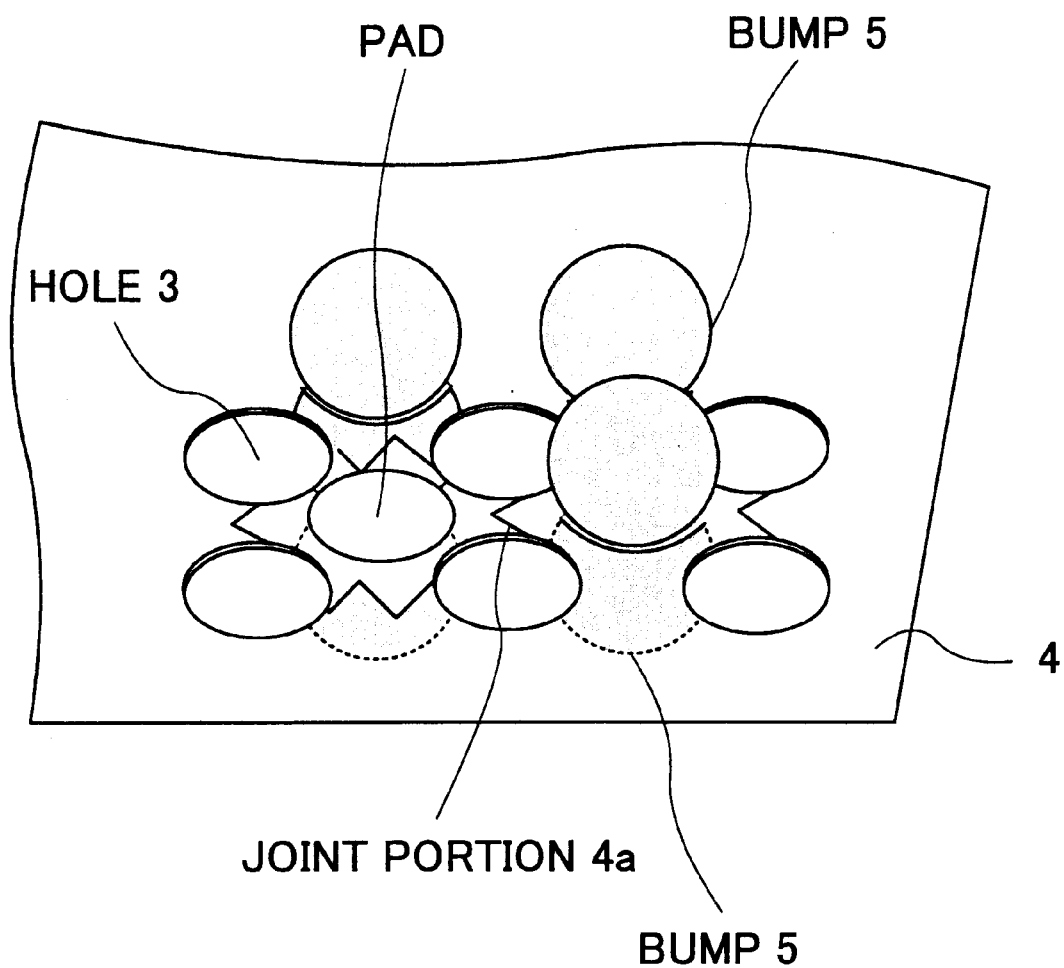
FIG. 2 is an enlarged view of a portion of a sheet-like interposer member of the semiconductor device indicated by the arrow A in FIG. 1.

FIG. 1 shows one embodiment of the semiconductor device according to the present invention. FIG. 2 is an enlarged view of a portion of a sheet-like interposer member 4 of the semiconductor device indicated by the arrow A in FIG. 1.

As shown in FIG. 1, the semiconductor device 10 of this embodiment generally includes a mounting chip 2, a sheet-like interposer member 4, a substrate 6, and multi-stage solder bumps 5. The mounting chip 2 includes a semiconductor element that is to be mounted on the semiconductor device in FIG. 1. The mounting chip 2 is bonded to the substrate 6. The sheet-like interposer member 4 is interposed between the substrate 6 and the mounting chip 2. By arranging two or more stages of solder bumps stacked between the mounting chip 2 and the substrate 6, the multi-stage solder bumps 5 that electrically connect the substrate 6 and the mounting chip 2 are formed.

In the semiconductor device 10 of this embodiment, a plurality of electrode pads 7 are arranged on the substrate 6 in a predetermined lattice formation, and the electrode pads 7 are electrically connected to the internal circuit of the substrate 6.

The sheet-like interposer member 4 is made of a resin material and arranged in the stacked stages of the multi-stage solder bumps 5. As shown in FIG. 2, the openings (holes) 3 are formed in the interposer member 4, so that each opening 3 is located between two diagonally arrayed bumps 5 of the multi-stage solder bumps 5.

The plurality of openings 3 are arranged in a predetermined lattice formation (for example, the pitch is in a range of 0.5 mm to 1.0 mm) that is essentially in agreement with the lattice formation of the electrode pads 7.

Moreover, in order to give a brittle structure for the sheet-like interposer member 5, it is desirable that the thickness of the sheet-like interposer member 4 is made as small as possible. For example, the sheet-like interposer member 4 in the present embodiment is about 100 μm in thickness.

Furthermore, in order to give a brittle structure, it is preferred that the sheet-like interposer member 4 is formed by using a glass-fabric containing resin as the resin material thereof. If the glass-fabric containing resin is used as the resin material of the interposer member 4 and the thickness of such sheet is about 100 μm, when a crack (or a fracture) occurs in the portion of the resin, the curvature is not created due to the heating in the mounted environment because of the glass fabric included in the resin of the interposer member 4, while the resin portion is subjected to a brittle fracture due to the thermal contraction of the substrate and the mounting chip and the repeated stress after the crack occurs.

As shown in FIG. 2, the sheet-like interposer member 4 is provided between the stacked stages of the multi-stage solder bumps 5. The two stages of the bumps 5 are stacked and bonded at the positions corresponding to the electrode pads 7 on the substrate 6.

Among the openings 3 of the sheet-like interposer member 4, the pads are embedded in the openings 3 which are located at the positions where the solder bumps of the multi-stage solder bumps 5 are stacked and bonded together. The openings 3 of the sheet-like interposer member 4 which are located adjacent to the positions (the embedded pads) where the solder bumps of the multi-stage solder bumps 5 are stacked and bonded together are through holes.

Moreover, the sheet-like interposer member 4 has joint portions 4a and each of the joint portions 4a interconnects two adjacent solder bumps of the multi-stage bumps 5 (which correspond to the positions of the embedded pads). A description of the operations of the joint portions 4a of the interposer member 4 will be given later.

In the semiconductor device 10 of this embodiment, the substrate 6 is an intermediate board called an interposer, and it is bonded to an external integrated-circuit board 9, which is called the mother board, via the plurality of balls 8 bonded to the back surface of the substrate 6 in a predetermined array.

In this case, the substrate 6 serves as the interposer that interconnects the integrated-circuit board 9 and the mounting chip 2.

However, in order to avoid confusion with the sheet-like interposer member 4 in the semiconductor device 10 of the present invention, hereinafter, only the element 4 will be called the interposer member and the element 6 will be called the substrate rather than calling the interposer.

Figure 6:
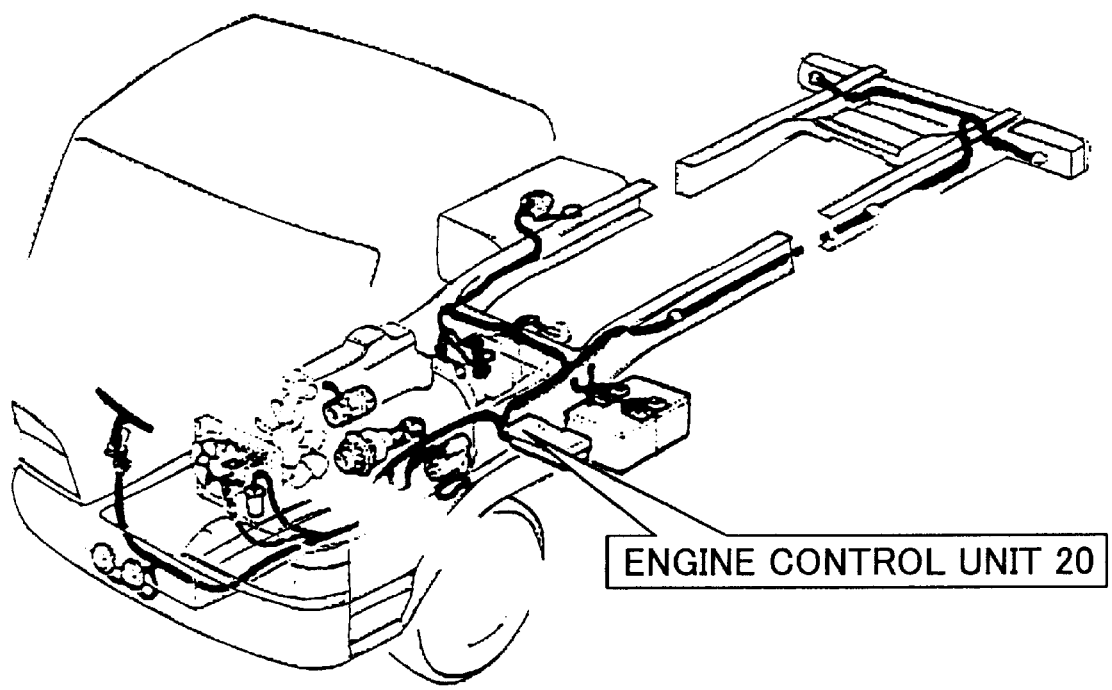
FIG. 6 is a diagram showing an engine control unit for an automotive vehicle to which the semiconductor device of the present invention is applied.

FIG. 6 shows an engine control unit 20 for an automotive vehicle to which the semiconductor device of the present invention is applied.

As shown in FIG. 6, the engine control unit 20 is a control equipment that includes an integrated circuit which carries out, for example, a fuel injection control of the engine during operation of the automobile vehicle.

A description will now be given of the toughness of the bump junctions when the semiconductor device of the present invention is attached to the engine control unit 20 of FIG. 6 with reference to FIG. 2.

In a case of two materials that are bonded together via the bump junctions and have significantly different coefficients of linear thermal expansion, when thermal contraction arises to the bump junctions on the two materials by the operating environment, they are subjected to the repeated stress over an extended period of time, which is liable to result in the trouble such as a crack or a fracture.

For example, in the embodiment of FIG. 1, the substrate 6 is made of a resin, such as a glass epoxy resin or a polyimide resin (or, in a certain case, a ceramic material), while the mounting chip 2 is made of silicon. Hence, the materials of the mounting chip 2 (silicon) and the substrate 6 (resin or ceramic) in the embodiment of FIG. 1 have different coefficients of linear thermal expansion.

In the semiconductor device 10 of this embodiment, the sheet-like interposer member 4 is provided to have a brittle structure except the portions corresponding to the solder bump junctions (the conductive portions of the multi-stage solder bumps 5). As shown in FIG. 2, the sheet-like interposer member 4 has the joint portions 4a each interconnecting two adjacent bumps of the multi-stage solder bump 5. The joint portions 4a are provided to fracture with a first stress that is smaller than a second stress which causes the bumps or the bonded areas of the bumps and the substrate 6 to crack when an external force is exerted on the bumps in a lateral direction. By using the stress generated in the mounting chip 2 and the substrate 6 according to the operating environment, the joint portions 4a of the sheet-like interposer member fracture, and the pillars which are formed with the two stacked solder bumps are formed independently of each other. Therefore, even in the severe operating environment of the engine control unit 20, the repeated stress acting on the solder bump junctions is eased by the brittle fracture of the joint portions 4a. It is possible that the operational life and reliability of the solder bump junctions in the semiconductor device 10 of this embodiment can be improved.

A description will now be given of the reason why the sheet-like interposer member 3 is provided to include the plurality of openings 3.

In the semiconductor device of the present invention, if the material of the mounting chip 2 and the material of the substrate 6 that are bonded via the bump junctions are subjected to the same thermal contraction and expansion, it will be satisfactory about the operational life and reliability of the bump junctions. However, the material of the mounting chip 2 and the material of the substrate 6 usually differs in many cases. For example, in the embodiment of FIG. 1, the mounting chip 2 is made of silicon, and the substrate 6 is made of a resin material. Generally, the thermal contraction of a resin is larger than that of silicon. If the heat expansion and contraction are repeated to the two materials, the bump junctions of the upper and lower sides of the two materials are subjected to the repeated stress. The repeated stress is an important factor that determines the operational life of the bump junctions in the semiconductor device.

In order to ease the above-mentioned stress, it is necessary to set up as greatly as possible the interval between the mounting chip 2 and the substrate 6 at the junctions. The balls and the bumps are used for the junctions. In the semiconductor device of the present invention, the sheet-like interposer member 4 is placed between the mounting chip 2 and the substrate 5 and the solder bumps are formed in the two upper and lower stages of the multi-stage bumps 6. The interval between the mounting chip 2 and the substrate 6 in the height direction can be enlarged to some extent according to the semiconductor device of the present invention;

However, when the multi-stage solder bumps 5 are formed, the sheet-like interposer member 4 that is placed in the middle of the multi-stage solder bumps 5 is also influenced by the repeated stress acting on the bump junctions. It is necessary to isolate the solder bump junctions from the peripheral portion of the interposer member 4.

Therefore, in order to improve the operational life and reliability of the bump junctions in the semiconductor device, it is preferred that the thickness of the sheet-like interposer member 4 is made as small as possible and the sheet-like interposer member 4 is formed with the plurality of openings 3 arranged in the lattice formation. By forming the sheet-like interposer member 4 with the openings 3, the repeated stress concentrates on the joint portions 4a each interconnecting two adjacent solder bumps of the multi-stage bumps 5, and the joint portions 4a are subjected to a brittle fracture by the thermal contraction of the substrate 6 and the mounting chip 2 in the severe operating environment, earlier than the solder bump junctions.

Consequently, the function which eases the repeated stress on the solder bump junctions is created by forming the independent pillars of the solder bumps on the two upper and lower stages of the multi-stage bumps 6 to enlarge the height thereof.

Figure 11:
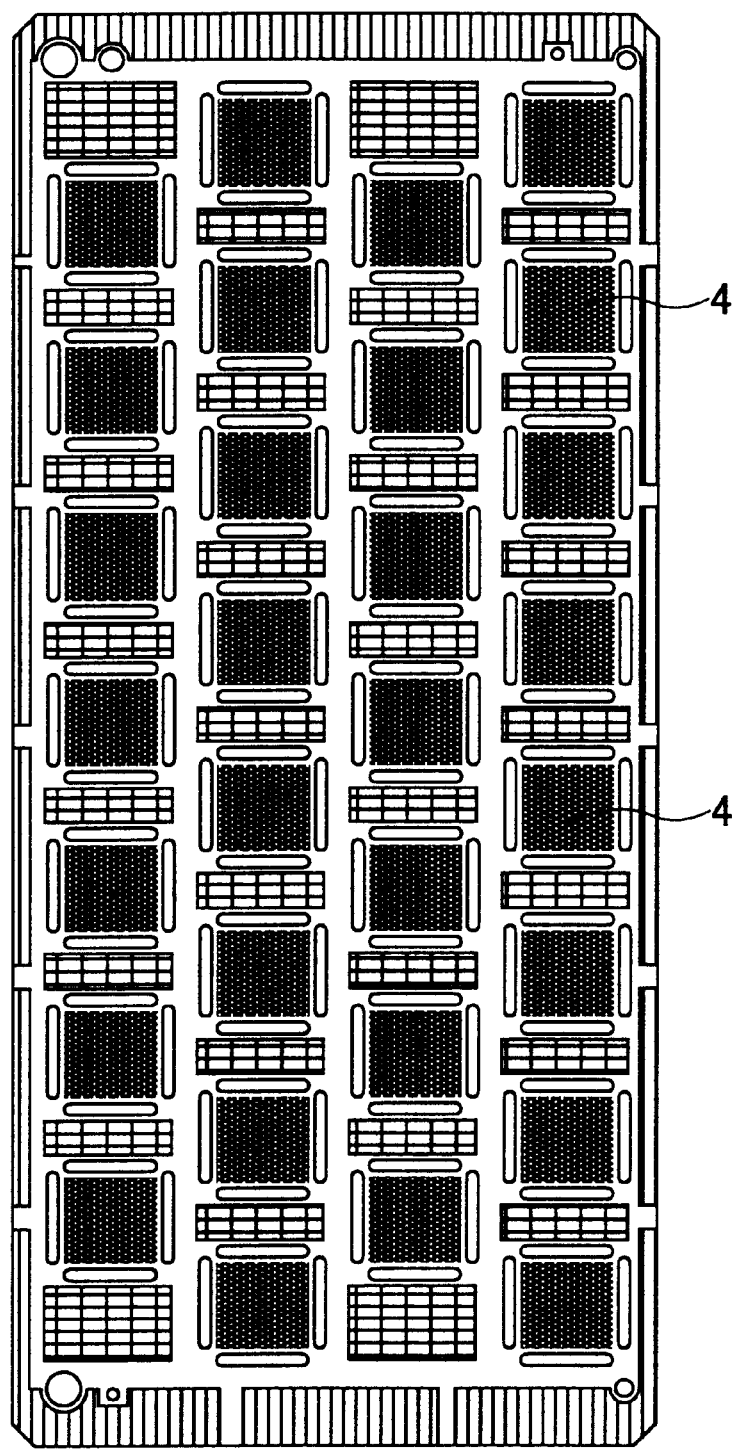
FIG. 11 is a diagram of a material sheet which is prepared in order to produce the sheet-like interposer member according to the present invention.

FIG. 11 shows a material sheet 100 which is prepared in order to produce the sheet-like interposer member 4 according to the present invention.

As shown in FIG. 11, by cutting one sheet of the material sheet 100, thirty sheets of the sheet-like interposer member 4 are produced. In each of such interposer members 4, the plurality of openings 3 as in the embodiment of FIG. 1 are formed. These openings 3 are arranged in a predetermined lattice formation (for example, the pitch is in a range of 0.5 mm to 1.0 mm) that is essentially in agreement with the lattice formation of the electrode pads 7 on the substrate 6.

Among the openings 3 of the sheet-like interposer member 4, the pads are embedded in the openings 3 which are located at the positions where the solder bumps of the multi-stage solder bumps 5 are stacked and bonded together. The openings 3 of the sheet-like interposer member 4 which are located adjacent to the positions (the embedded pads) where the solder bumps of the multi-stage solder bumps 5 are stacked and bonded together are through holes.

Moreover, the source material of the material sheet 100 is a resin, such as a glass epoxy resin. In the present embodiment, MCL-E-679 (Hitachi Chemical) or MCL-E-679F (Hitachi Chemical) is used as the source material of the material sheet 100.

As previously described with the embodiment of FIG. 1, in order to give the brittleness of the joint portions 4a, the thickness of the portions of the material sheet 100 corresponding to the respective interposer members are set to about 100 $\mu$m.

Figure 3:
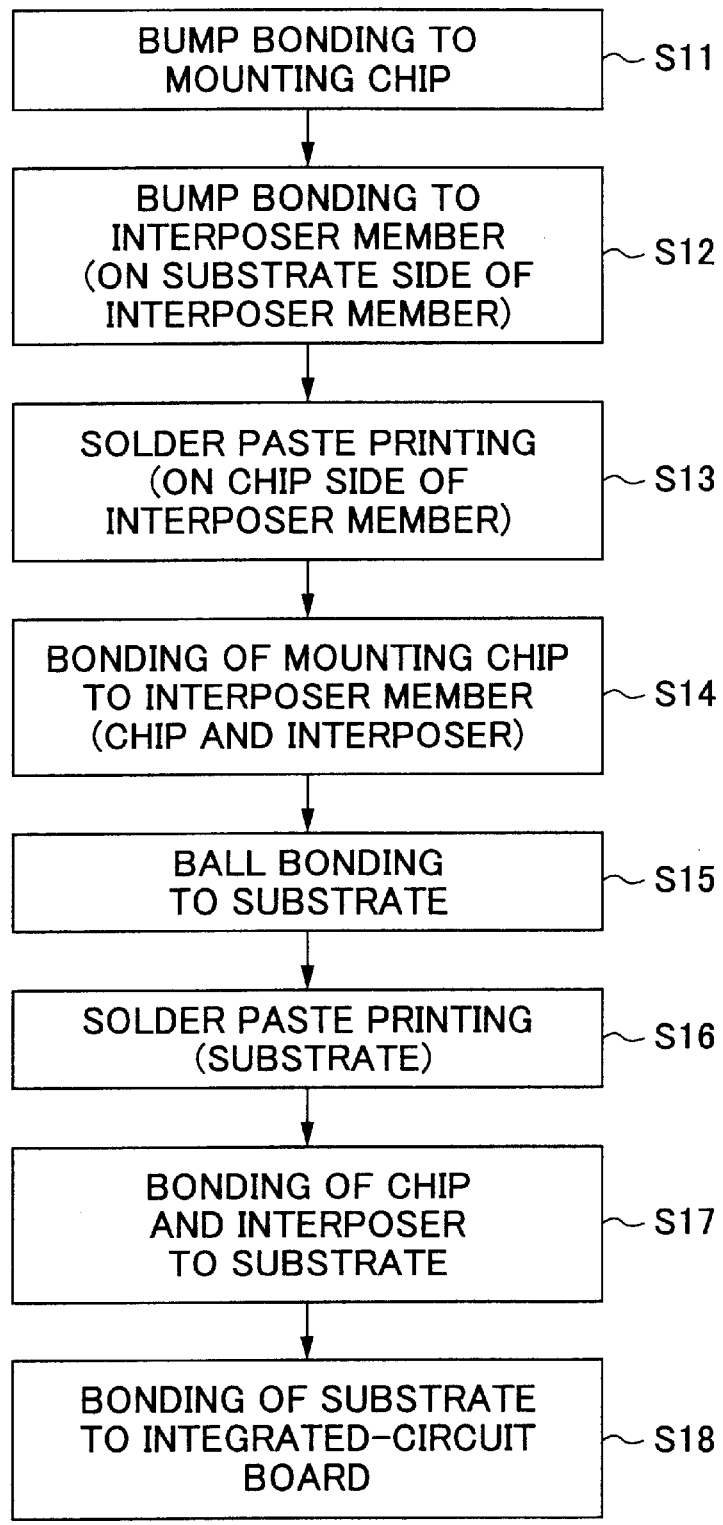
FIG. 3 is a flowchart for explaining one embodiment of the manufacturing method of the semiconductor device according to the present invention.
Figure 4:
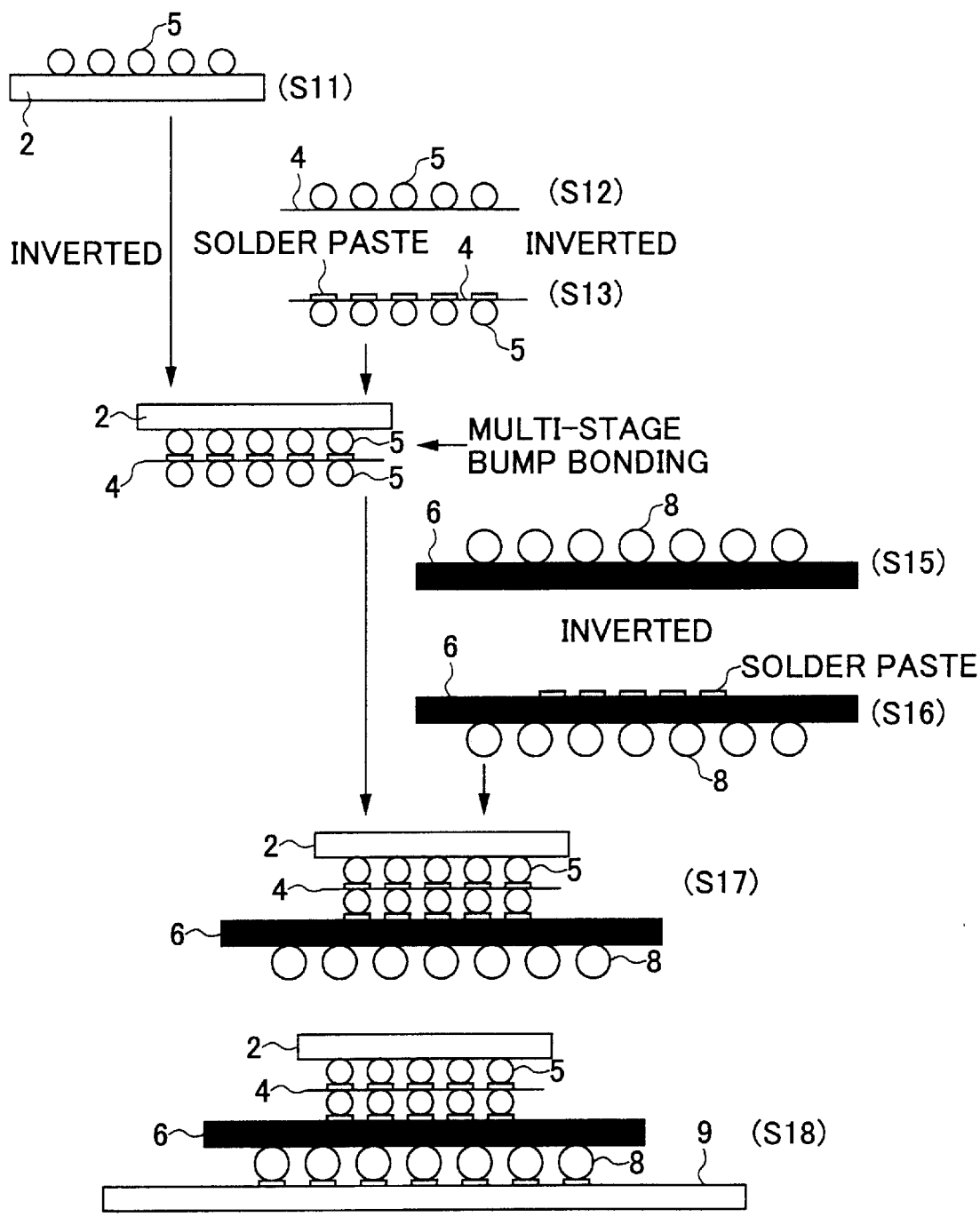
FIG. 4 is a diagram for explaining the manufacturing method of the semiconductor device shown in FIG. 3.

FIG. 3 is a flowchart for explaining one embodiment of the manufacturing method of the semiconductor device according to the present invention. FIG. 4 is a diagram for explaining the manufacturing method of the semiconductor device shown in FIG. 3.

As shown in FIG. 3 and FIG. 4, the plurality of solder bumps 5 that are arrayed at a predetermined first pitch are bonded to the mounting chip 2 (S11). The mounting chip 2 with the bumps 5 bonded is inverted.

Next, the plurality of solder bumps 5 that are arrayed at the first pitch are bonded to the first surface of the interposer member 4 (on the substrate side of the member 4) (S12). The interposer member 4 with the bumps 5 bonded is inverted.

By using a known solder paste printing process, a solder paste (which is a gel-like solder with which solder grains are intermingled in flux) is applied to the second surface (opposite to the first surface) of the interposer member 5 at the positions corresponding to the solder bumps 5 on the first surface thereof (S13). The second surface of the interposer member 4 is the surface facing the mounting chip 2, and the first surface of the interposer member 4 is the surface facing the substrate 6.

The mounting chip 2 which is inverted is arranged on the second surface of the interposer member 4, and the reflow processing is performed with the solder paste applied in the step S13, so that the multi-stage solder bumps 5 are formed (S14).

In the step S14, the solder paste is used to bond together the bumps 5 on the mounting chip 2 and the bumps 5 on the interposer member 4 by the heating of the reflow processing. The multi-stage solder bumps 5 are thus formed. Hereinafter, the resulting element with the multi-stage solder bumps 5 will be called the chip and interposer.

On the other hand, the plurality of balls 8 that are arrayed at a predetermined second pitch (which is larger than the first pitch of the solder bumps 5) are bonded to the substrate 6 (S15). The substrate 6 with the balls 8 bonded is inverted.

By using the solder paste printing process, a solder paste is applied to the top surface (opposite to the surface where the balls 8 are bonded) of the substrate 6 at the positions corresponding to the solder bumps 5 on the interposer member 4 (S16). The positions where the solder paste is applied also correspond to the positions the electrode pads are provided on the top surface of the substrate 6.

The chip and interposer which is formed in the step S14 is placed onto the top surface of the substrate 6, and the reflow processing is performed with the solder paste applied in the step S16 (S17). In this step S17, the solder paste is used to bond together the bumps 5 on the interposer member 4 and the electrode pads 7 on the substrate 6 by the heating of the reflow processing. The mounting chip 2 is thus mounted on the substrate 6 via the interposer member 4. Therefore, the substrate 6 and the mounting chip 2 are electrically connected by the multi-stage solder bumps 5.

In the case of the present embodiment, the mounting chip 2 will be influenced by the heating of the reflow processing in the steps S14 and S17.

In some cases, the semiconductor device 10 which is produced as the result of the steps S11–S17 may be used in this state. In other cases, the semiconductor device is further provided with the integrated-circuit board 9, such as the motherboard. In the latter cases, the solder paste is applied to the surface of the integrated-circuit board 9, and the balls 8 on the back surface of the substrate 6 are bonded to the integrated-circuit board 8 through the reflow processing (S18).

The semiconductor device 10 of the present embodiment which is produced as the result of the steps S11–S18 may be mounted on the chassis of an automotive vehicle as the engine control unit 20 (FIG. 6).

Figure 5:
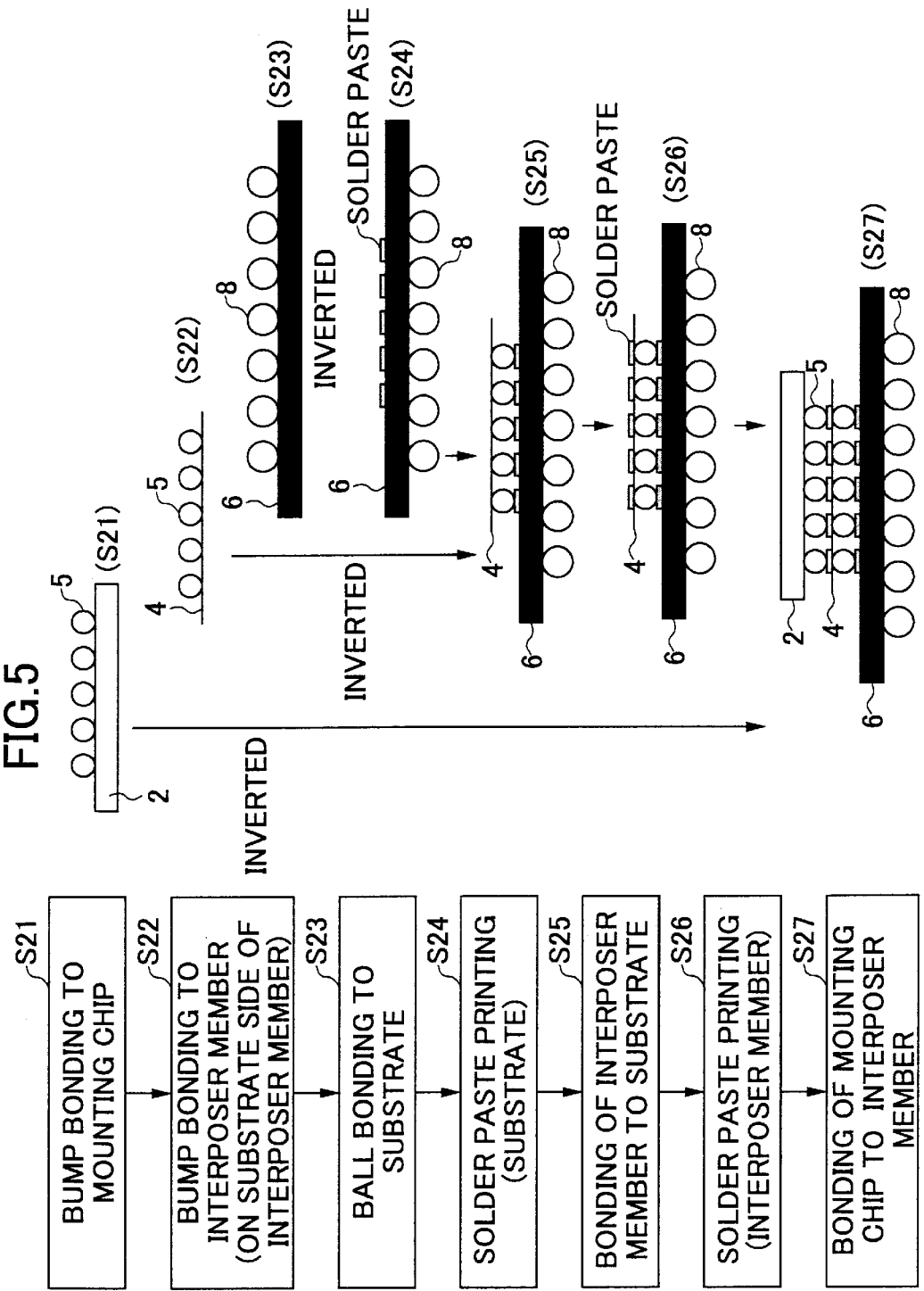
FIG. 5 is a flowchart for explaining another embodiment of the manufacturing method of the semiconductor device according to the present invention.

FIG. 5 shows another embodiment of the manufacturing method of the semiconductor device according to the present invention.

As shown in FIG. 5, in the present embodiment, the plurality of solder bumps 5 that are arrayed at a predetermined first pitch are bonded to the mounting chip 2 (S21). The mounting chip 2 with the bumps 5 bonded is inverted.

The plurality of solder bumps 5 that are arrayed at the first pitch are bonded to the first surface of the interposer member 4 (S22). The first surface of the interposer member 4 is the surface facing the substrate 6. The interposer member 4 with the bumps 5 bonded is inverted.

The plurality of balls 8 that are arrayed at a predetermined second pitch (which is larger than the first pitch of the solder bumps 5) are bonded to the substrate 6 (S23). The substrate 6 with the balls 8 bonded is inverted.

By using the solder paste printing process, a solder paste is applied to the top surface (opposite to the ball-bonded surface) of the substrate 6 at the positions corresponding to the solder bumps 5 on the first surface of the interposer member 4 (S24). The positions where the solder paste is applied in the step S24 also correspond to the positions of the electrode pads 7 on the top surface of the substrate 6.

The interposer member 4 which is inverted is arranged on the top surface of the substrate 6, and the reflow processing is performed with the solder paste applied in the step S24, so that the interposer member 4 is bonded to the substrate 6 (S25). Furthermore, by using the solder paste printing process, a solder paste is applied to the second surface (opposite to the first surface on which the bumps 5 are bonded) of the interposer member 4 at the positions corresponding to the bumps 5 on the mounting chip 2 (S26).

The mounting chip 2 with the bumps 5 bonded which is inverted in the step S21 is placed onto the second surface of the interposer member 4, and the reflow processing is performed with the solder paste applied in the step S26 (S27). In the step S27, the solder paste is used to bond together the bumps 5 on the interposer member 4 and the bumps 5 on the mounting chip 2 by the heating of the reflow processing, so that the multi-stage solder bumps 5 are formed. The mounting chip 2 is thus mounted on the substrate 6 via the interposer member 4. Therefore, the substrate 6 and the mounting chip 2 are electrically connected by the multi-stage solder bumps 5.

In the case of the present embodiment, the mounting chip 2 is influenced by the heating of the reflow processing in the step S27 only, which is different from the case of the previous embodiment of FIG. 3. When the mounting chip 2 contains the semiconductor element the performance of which tends to deteriorate due to the influences of the heating, the manufacturing method of the present embodiment is useful to avoid the performance degradation of the semiconductor element in the chip 2, since the mounting chip 2 receives the heat of the reflow processing only in the step S27.

FIG. 7A, FIG. 7B, FIG. 7C and FIG. 7D show variations of the sheet-like interposer member 4 according to the present invention.

As previously described, the sheet-like interposer member 4 is provided to have a brittle structure except the portions corresponding to the solder bump junctions (the conductive portions of the multi-stage solder bumps 5). Namely, the sheet-like interposer member 4 has the joint portions 4a each interconnecting two adjacent bumps of the multi-stage solder bump 5. The joint portions 4a are provided to fracture with a first stress that is smaller than a second stress which causes the bumps or the bonded areas of the bumps and the substrate 6 to crack when an external force is exerted on the bumps in a lateral direction.

Therefore, in order to allow the joint portions 4a to provide the brittle structure for the interposer member 6, it is necessary to devise the configuration of the openings 3 of the interposer member 4.

Figure 7A:
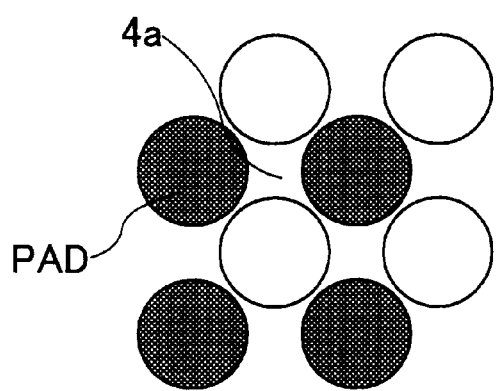
FIG. 7A, FIG. 7B, FIG. 7C and FIG. 7D are diagrams of variations of the sheet-like interposer member according to the present invention.
Figure 7B:
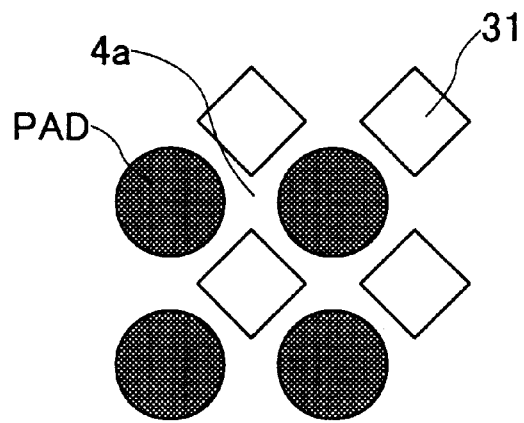
Figure 7C:
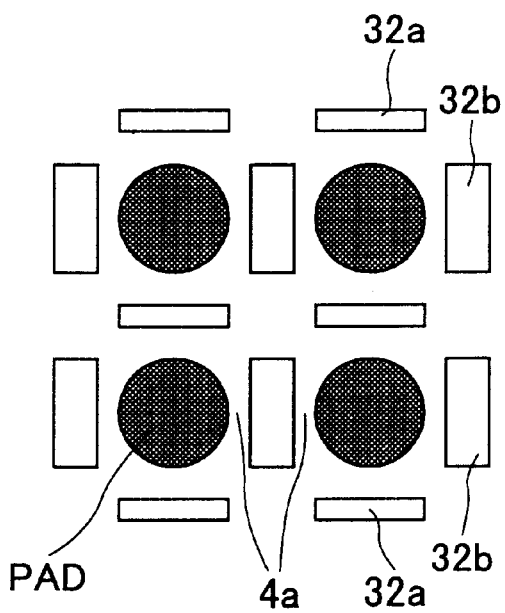
Figure 7D:
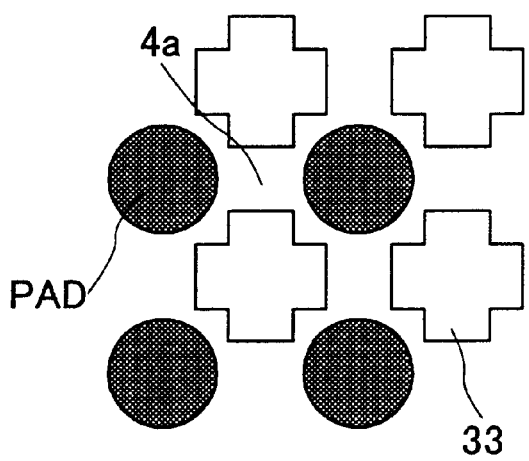

Usually, the configuration of the openings 3 shown in FIG. 7A is utilized by taking into consideration the manufacturing cost. In this case, a known punching process using the drill is performed and the openings 3 in the form of a circle are formed in the interposer member 2.

Considering as the smallest possible width is more desirable, in order to provide a brittle structure for the interposer member 4, so that the joint portions 4a each interconnecting two adjacent solder bumps.

It is also possible to use a known punching process such as a laser processing etc. Hence, the openings of the interposer member 4 according to the present invention may be shaped in the form of any of rhombus-shaped holes 31 shown in FIG. 7B, rectangular form holes 32a and 32b shown in FIG. 7C, or cross-shaped holes 33 shown in FIG. 7D.

By providing the sheet-like interposer member 4, which has the openings 3 that are in the form of one of such holes shown in FIG. 7A through FIG. 7D, in the semiconductor device 10, the repeated stress acting on the bump junctions when the semiconductor device 10 is used in the severe operating environment of the engine control unit 20 can be eased as much as possible, and the operating life and reliability can be improved by using the sheet-like interposer member 4.

Figure 8:
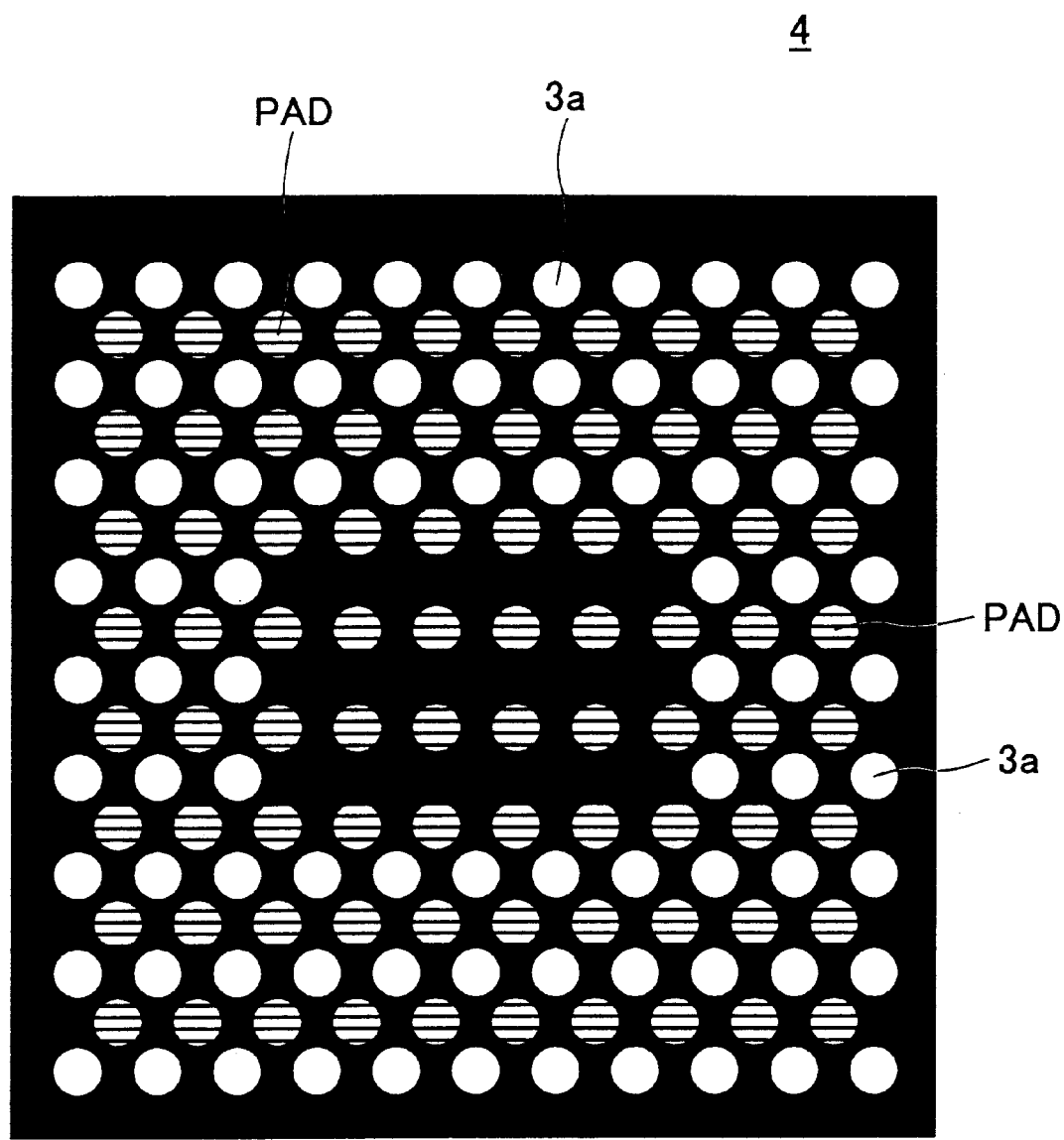
FIG. 8 is a diagram of a variation of the sheet-like interposer member according to the present invention.

FIG. 8 shows another variation of the sheet-like interposer member 4 according to the present invention.

As shown in FIG. 8, the interposer member 4 of this embodiment is provided to have a plurality of openings 3a that are located only in a peripheral portion of the interposer member 4, the peripheral portion surrounding the bonded areas where the electrode pads on the substrate 6 and the multi-stage solder bumps 5 are bonded together.

Generally, in the embodiment of FIG. 1, the repeated stress exerted on the multi-stage solder bumps 5 when a thermal contraction arises due to the operating environment of the semiconductor device is larger in the peripheral portion of the interposer member 4 than in the middle portion thereof. This tendency becomes more remarkable as the size of the mounting chip 2 becomes large.

Therefore, when the size of the mounting chip 2 is relatively large (for example, the size of 30 mm×30 mm or larger), the sheet-like interposer member 4 is provided to have the openings 3a only in the peripheral portion shown in FIG. 8.

The increased repeated stress can be effectively eased by using the sheet-like interposer member 4 having the configuration of FIG. 8.

Figure 9:
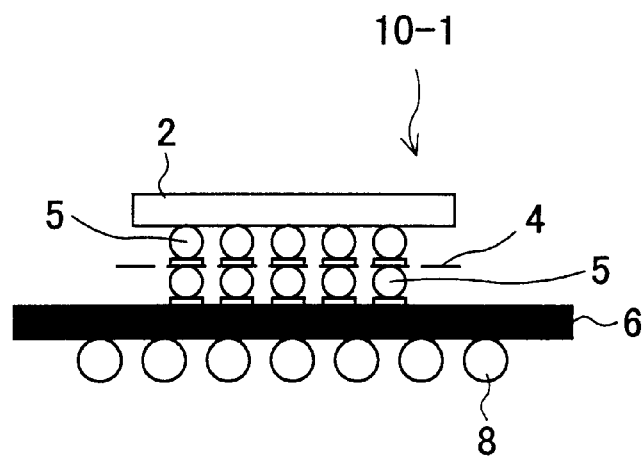
FIG. 9 is a diagram of an example of a mounting chip package which is configured as the semiconductor device of the present invention.

FIG. 9 shows an example of a mounting chip package which is configured as the semiconductor device of the present invention.

As shown in FIG. 9, the semiconductor device 10-1 is configured into the mounting chip package including no integrated-circuit board 9. The mounting chip package may be an intermediate product. It is possible to mount the semiconductor device 10-1 on a certain specific integrated-circuit board 9 for use, and it is possible to use the semiconductor device 10-1 for the other purposes.

The semiconductor device 10-1 in FIG. 9 includes the substrate 6, the multi-stage bumps 5, the sheet-like interposer member 4 and the mounting chip 2. The mounting chip 2 is bonded to the substrate 6 via the interposer member 4. The multi-stage bumps 5 have two or more stages of solder bumps stacked and bonded so that the substrate 6 and the mounting chip 2 are electrically connected by the multi-stage bumps 5. The interposer member 4 is made of a resin material and provided in the stacked stages of the multi-stage bumps 5. The interposer member 4 has the openings 3 each formed between two diagonally arrayed bumps of the multi-stage bumps 5 as shown in FIG. 2. Moreover, a BGA package or the like may be used as the mounting chip 2 in the semiconductor device 10-1 of this embodiment.

The semiconductor device of the present invention is not limited to the embodiment of FIG. 1, and various variations may be possible with respect to the combinations of the mounting chip 2 and the substrate 6 according to the use.

Figure 10:
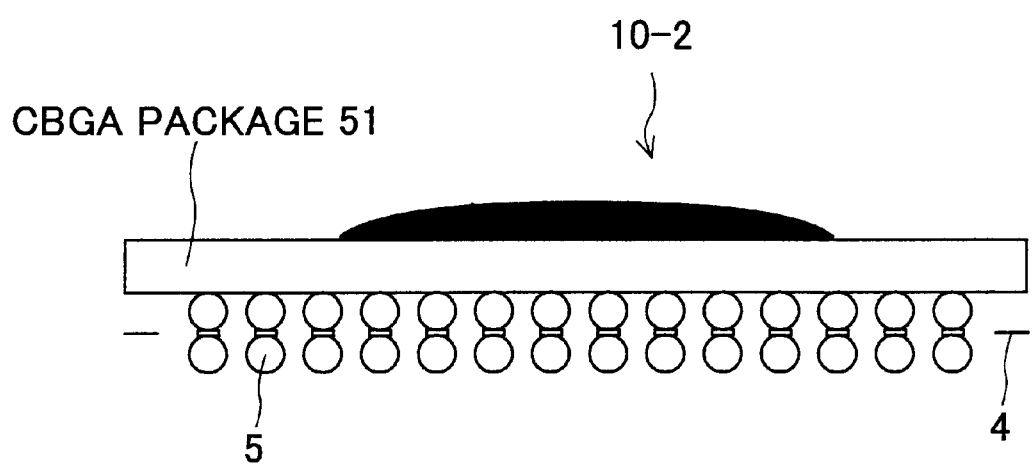
FIG. 10 is a diagram of an example of a ball-grid-array package to which the semiconductor device of the present invention is applied.

FIG. 10 shows an example of a ball-grid-array package 51 to which the semiconductor device of the present invention is applied.

As shown in FIG. 10, the semiconductor device 10-2 includes the ball-grid-array package 51 (for example, a CBGA package), the sheet-like interposer member 4 and the multi-stage bumps 5. The multi-stage bumps 5 have two or more stages of solder bumps stacked and bonded so that the ball-grid-array package 51 and an external integrated-circuit board (not shown) are electrically connected by the multi-stage bumps 5. The interposer member 4 is made of a resin material and provided in the stacked stages of the multi-stage bumps 5. The interposer member 4 has the openings 3 each formed between two diagonally arrayed bumps of the multi-stage bumps 5 as shown in FIG. 2.

The semiconductor device of this embodiment is useful when the size of the mounting chip is relatively large (for example, the size of 30 mm×30 mm or larger), such as a CBGA package, and the mounting chip is mounted on an external integrated-circuit board. Similar to the previous embodiments, the sheet-like interposer member 4 according to the present invention is combined with such semiconductor device, and it is possible to secure the operational life and reliability of the bump junctions of the multi-stage bumps 6 over an extended period of time.

The present invention is not limited to the above-described embodiments, and variations and modifications may be made without departing from the scope of the present invention.

Further, the present invention is based on Japanese priority application No. 2002-059220, filed on Mar. 5, 2002, the entire contents of which are hereby incorporated by reference.

What is claimed is:

1. A semiconductor device comprising:

a substrate;

a mounting chip bonded to the substrate;

multi-stage bumps having two or more stages of bumps stacked and bonded so that the substrate and the mounting chip are electrically connected by the multi-stage bumps; and a sheet-like interposer member of a resin material provided in the stacked stages of the multi-stage bumps and having openings each formed between two diagonally arrayed bumps of the multi-stage bumps.

2. A semiconductor device comprising:

a substrate;

a mounting chip bonded to the substrate;

multi-stage bumps having two or more stages of bumps stacked and bonded so that the substrate and the mounting chip are electrically connected by the multi-stage bumps; and a sheet-like interposer member of a resin material provided in the stacked stages of the multi-stage bumps and having openings each formed between two diagonally arrayed bumps of the multi-stage bumps, the interposer member having joint portions each interconnecting two adjacent bumps of the multi-stage bumps.

3. The semiconductor device of claim 2 wherein the joint portions of the interposer member are provided to fracture with a first stress that is smaller than a second stress which causes the bumps or bonded areas of the bumps and the substrate to crack when an external force is exerted on the bumps in a lateral direction.

4. The semiconductor device of claim 1 wherein the resin material of the interposer member is a glass-fabric containing resin.

5. The semiconductor device of claim 1 wherein the substrate and the mounting chip are provided to have different coefficients of linear thermal expansion.

6. The semiconductor device of claim 1 wherein the openings of the interposer member are shaped in the form of one of a circle, a rectangle and a cross.

7. A sheet-like interposer member for use in a semiconductor device including a substrate, a mounting chip bonded to the substrate, and multi-stage bumps having two or more stages of bumps stacked and bonded so that the substrate and the mounting chip are electrically connected by the multi-stage bumps, the interposer member being of a resin material and provided in the stacked stages of the multi-stage bumps and having openings each formed between two diagonally arrayed bumps of the multi-stage bumps.

8. The semiconductor device of claim 1 wherein the openings of the interposer member are provided so that the openings are located in a peripheral portion of the interposer member, the peripheral portion surrounding bonded areas where electrode pads on the substrate and the multi-stage bumps are bonded together.

9. The semiconductor device of claim 2 wherein the joint portions of the interposer member and bonded areas of the multi-stage bumps are arranged in a lattice formation so that the joint portions and the bonded areas adjoin each other mutually.

10. A semiconductor device comprising:

a ball-grid-array package;

multi-stage bumps having two or more stages of bumps stacked and bonded so that the ball-grid-array package and an external integrated-circuit board are electrically connected by the multi-stage bumps; and a sheet-like interposer member of a resin material provided in the stacked stages of the multi-stage bumps and having openings each formed between two diagonally arrayed bumps of the multi-stage bumps.

11. The semiconductor device of claim 10 wherein the interposer member comprises joint portions that are subjected to a brittle fracture due to thermal contraction of the ball-grid-array package and the integrated-circuit board.

* * * * *